(12) United States Patent
Ikegami

(10) Patent No.: US 12,444,583 B2
(45) Date of Patent: Oct. 14, 2025

(54) ELECTROSTATIC ATTRACTION METHOD AND PLASMA PROCESSING APPARATUS

(71) Applicant: TOKYO ELECTRON LIMITED, Tokyo (JP)

(72) Inventor: Masashi Ikegami, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 1359 days.

(21) Appl. No.: 17/018,662

(22) Filed: Sep. 11, 2020

(65) Prior Publication Data
US 2021/0082671 A1    Mar. 18, 2021

(30) Foreign Application Priority Data
Sep. 12, 2019 (JP) .................... 2019-165817

(51) Int. Cl.
*H01L 21/00* (2006.01)
*C23C 16/00* (2006.01)
*H01J 37/32* (2006.01)

(52) U.S. Cl.
CPC .. *H01J 37/32697* (2013.01); *H01J 37/32532* (2013.01); *H01J 37/32642* (2013.01); *H01J 37/32706* (2013.01)

(58) Field of Classification Search
None
See application file for complete search history.

(56) References Cited

U.S. PATENT DOCUMENTS

| 11,894,218 B2* | 2/2024 | Takayama ............... H02N 13/00 |
| 2005/0103275 A1* | 5/2005 | Sasaki ............... H01J 37/32706 118/728 |
| 2016/0172161 A1* | 6/2016 | Ikenaga ............ H01J 37/32724 156/345.28 |
| 2016/0189994 A1* | 6/2016 | Sasaki ............... H01L 21/67109 361/234 |
| 2018/0350565 A1 | 12/2018 | Matsuyama et al. |
| 2019/0221464 A1* | 7/2019 | Sasaki ................. H01L 21/6833 |
| 2021/0005495 A1* | 1/2021 | Sasaki .................... H02N 13/00 |
| 2021/0074522 A1* | 3/2021 | Matsuyama ...... H01J 37/32642 |

FOREIGN PATENT DOCUMENTS

JP    2018-206935 A    12/2018

* cited by examiner

*Primary Examiner* — Parviz Hassanzadeh
*Assistant Examiner* — Michelle Crowell
(74) *Attorney, Agent, or Firm* — XSENSUS LLP

(57) ABSTRACT

An electrostatic attraction method is provided. In the electrostatic attraction method, voltages are applied to one or more electrodes disposed in a substrate support while reversing the polarities of the voltages for each process cycle for plasma treatment. The one or more electrodes are disposed in the substrate support at at least a position corresponding to a ring member placed on the substrate support to surround a substrate serving as a plasma treatment target placed on the substrate support.

14 Claims, 15 Drawing Sheets

MIGRATION PROGRESSES AND ATTRACTION FORCE DECREASES

FIG. 6

| SEQUENCE | PLASMA TREATMENT | WLDC |
|---|---|---|
| COMPARATIVE EXAMPLE | +,− | −,+ |
| TEST EXAMPLE (PRESENT EMBODIMENT) | +,−/−,+ | −,+/+,− |

FIG. 7

| SEQUENCE | PLASMA TREATMENT | | | |
|---|---|---|---|---|
| | P1 | P2 | P3 | P4 |
| BIPOLAR | +,− | +,− | +,− | +,− |
| ANTI BIPOLAR | −,+ | −,+ | −,+ | −,+ |

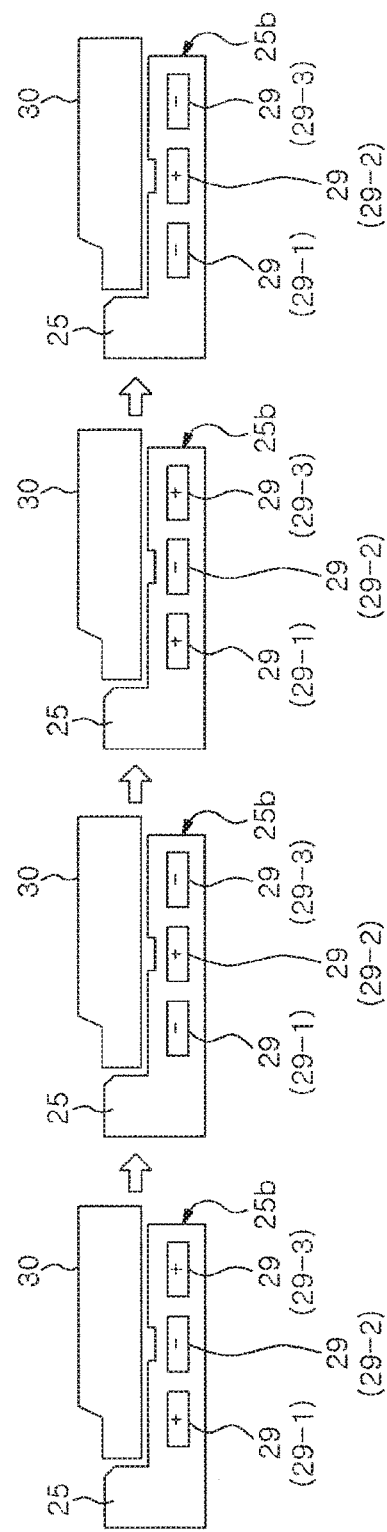

FIG.16

| TYPE | AMOUNT OF MIGRATED CHANGES |
|---|---|
| PLASMA TREATMENT a | 3 |
| PLASMA TREATMENT b | 1 |
| PLASMA TREATMENT c | 12 |
| ⋮ | |

ELECTROSTATIC ATTRACTION METHOD AND PLASMA PROCESSING APPARATUS

CROSS-REFERENCE TO RELATED APPLICATIONS

This application claims priority to Japanese Patent Application No. 2019-165817, filed on Sep. 12, 2019, the entire contents of which are incorporated herein by reference.

TECHNICAL FIELD

The present disclosure relates to an electrostatic attraction method and a plasma processing apparatus.

BACKGROUND

Japanese Patent Application Publication No. 2018-206935 discloses a plasma processing apparatus in which an electrode is disposed in a substrate support, on which a focus ring is placed, to face the focus ring, and a voltage is applied to the electrode while periodically switching the polarity of the voltage during plasma treatment.

The present disclosure provides a technique for simply suppressing the decrease of an attraction force of a ring member.

SUMMARY

In accordance with an aspect of the present disclosure, there is provided an electrostatic attraction method including: applying voltages to one or more electrodes disposed in a substrate support while reversing polarities of the voltages for each process cycle for plasma treatment. The one or more electrodes are disposed in the substrate support at at least a position corresponding to a ring member placed on the substrate support to surround a substrate serving as a plasma treatment target placed on the substrate support.

BRIEF DESCRIPTION OF THE DRAWINGS

The objects and features of the present disclosure will become apparent from the following description of embodiments, given in conjunction with the accompanying drawings, in which:

FIG. 6 is a view explaining voltage application patterns in the case of performing plasma treatment and waferless dry cleaning (WLDC);

FIG. 7 is a view explaining voltage application patterns in the case of performing plasma treatment.

FIG. 13B schematically shows still another example of an applied voltage change pattern according to the first embodiment;

FIG. 16 schematically shows an example of a data structure of charge transfer information according to the second embodiment.

DETAILED DESCRIPTION

Hereinafter, embodiments of an electrostatic attraction method and a plasma processing apparatus of the present disclosure will be described in detail with reference to the drawings. The following embodiments are not intended to limit the electrostatic attraction method and the plasma processing apparatus of the present disclosure. The embodiments may be appropriately combined without contradicting processing contents.

In the plasma processing apparatus, a voltage is applied to an electrode in a substrate support to electrostatically attract and hold an edge ring such as a focus ring or the like. However, charge migration from the edge ring to an electrostatic chuck may occur, which may result in the decrease of an attraction force of the edge ring. Therefore, in Japanese Patent Application Publication No. 2018-206935, a voltage is applied to the electrode while periodically switching the polarity of the voltage during plasma treatment. However, in the case of applying the voltage while periodically switching the polarity of the voltage during the plasma treatment, it is necessary to optimize the timing and the cycle of switching the polarities. Since the plasma treatment has various recipes, large man-hours are required to optimize the individual recipes. Thus, it is desirable to simply suppress the decrease of the attraction force of the edge ring.

First Embodiment

Figure 1:
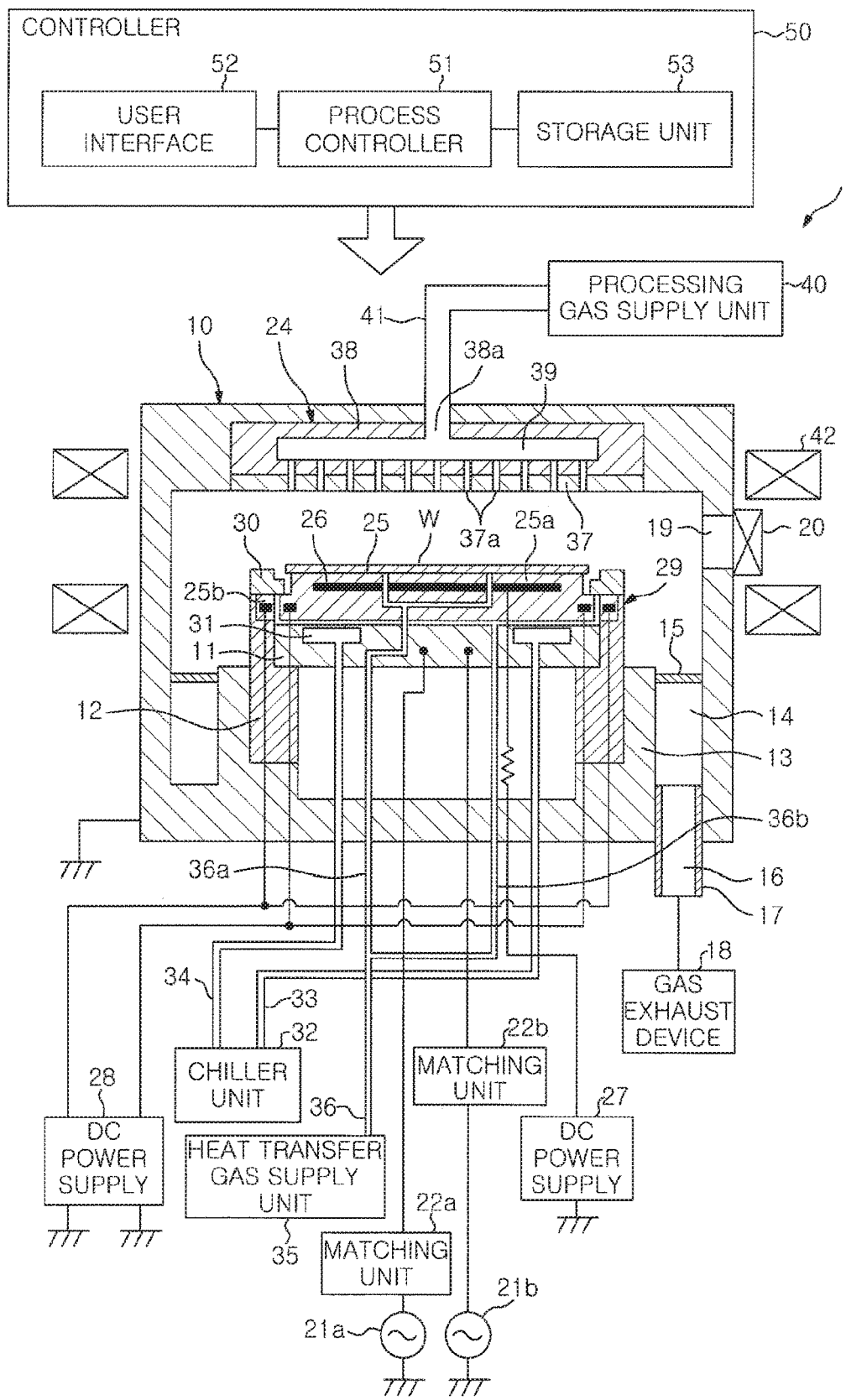
FIG. 1 is a cross-sectional view showing a schematic configuration of a plasma processing apparatus according to a first embodiment.

Next, a plasma processing apparatus 1 according to a first embodiment will be described. FIG. 1 is a cross-sectional view showing a schematic configuration of the plasma processing apparatus 1 according to the first embodiment. In the first embodiment, an example in which the plasma processing apparatus 1 is configured as a reactive ion etching (RIE) type plasma processing apparatus will be described. However, the plasma processing apparatus 1 may be configured as a plasma etching apparatus using surface wave plasma, a plasma CVD apparatus, or the like.

Referring to FIG. 1, the plasma processing apparatus 1 includes a cylindrical processing chamber 10 that is made of a metal, for example, aluminum or stainless steel, and is frame-grounded. In the plasma processing apparatus 1, a disc-shaped susceptor (lower electrode) 11 is provided and configured to place thereon a semiconductor wafer (hereinafter, referred to as "wafer") W that is a plasma treatment target. The susceptor 11 is made of, for example, aluminum, and is supported by a cylindrical support 13 extending vertically upward from the bottom of the processing chamber 10 via an insulating cylindrical holder 12. The susceptor 11 is an example of the substrate support of the present disclosure.

A gas exhaust path 14 is formed between a sidewall of the processing chamber 10 and the cylindrical support 13. An annular baffle plate 15 is disposed at an inlet or midway of the gas exhaust path 14. A gas exhaust port 16 is disposed at the bottom of the gas exhaust path 14. A gas exhaust device 18 is connected to the gas exhaust port 16 through a gas exhaust line 17. The gas exhaust device 18 includes a vacuum pump to reduce the pressure in a processing space in the processing chamber 10 to a predetermined vacuum level. Further, the gas exhaust line 17 has an automatic pressure control valve (hereinafter, referred to as "APC") (not shown) that is a variable type butterfly valve. The APC automatically controls the pressure in the processing chamber 10. Further, a gate valve 20 is disposed at the sidewall of the processing chamber 10 to open and close a loading/unloading port 19 for the wafer W.

A first radio frequency (RF) power supply 21a is electrically connected to the susceptor 11 through a first matching unit 22a. A second RE power supply 21b is electrically connected to the susceptor 11 through a second matching unit 22b. The first RF power supply 21a is a power supply for plasma generation and applies RF power having a predetermined frequency (e.g., 100 MHz) to the susceptor 11 during the plasma treatment. The second RF power supply 21b is a power supply for ion attraction (for bias) and applies RF power having a frequency (e.g., 13 MHz) lower than that of the RF power of the first RF power supply 21a to the susceptor 11 during the plasma treatment. A shower head 24 serving as an upper electrode having a ground potential (to be described later) is disposed at a ceiling portion of the processing chamber 10. Therefore, RF voltages of two frequencies from the first RF power supply 21a and the second RF power supply 21b are applied between the susceptor 11 and the shower head 24.

An electrostatic chuck 25 is disposed on an upper surface of the susceptor 11 to attract and hold the wafer W with an electrostatic attraction force. The electrostatic chuck 25 has a disc-shaped central portion 25a on which the wafer W is placed and an annular outer peripheral portion 25b formed to surround the central portion 25a. The central portion 25a protrudes upward in FIG. 1 with respect to the outer peripheral portion 25b. A ring-shaped edge ring 30 such as a focus ring is disposed on an upper surface of the outer peripheral portion 25b to surround the central portion 25a in an annular shape. The edge ring 30 is an example of a ring member of the present disclosure. The edge ring 30 is consumed by plasma treatment. The central portion 25a is formed by embedding an electrode plate 26 made of a conductive film between a pair of dielectric films. The outer peripheral portion 25b is formed by embedding an electrode plate 29 made of a conductive film between a pair of dielectric films. In the present embodiment, two annular electrode plates 29 are arranged side by side. A DC power supply 27 is electrically connected to the electrode plate 26. The DC power supply 28 is electrically connected to each of the two electrode plates 29. The DC power supply 27 and the DC power supply 28 are configured to change levels and polarities of DC voltages to be supplied. The DC power supply 27 applies a DC voltage to the electrode plate 26 under the control of a controller 50 to be described later. The DC power supply 28 applies a DC voltage to each of the two electrode plates 29 under the control of the controller 50 to be described later. The electrostatic chuck 25 generates an electrostatic force such as a Coulomb force by the voltage applied from the DC power supply 27 to the electrode plate 26, and the wafer W is attracted and held on the electrostatic chuck 25 by the electrostatic force thus generated. Further, the electrostatic chuck 25 generates an electrostatic force such as a Coulomb force by the voltage applied from the DC power supply 28 to each of the electrode plates 29, and the edge ring 30 is attracted and held on the electrostatic chuck 25 by the electrostatic force thus generated. Details of the installation of the electrode plate(s) 29 will be described later.

Further, an annular coolant space 31 extending in, e.g., a circumferential direction, is provided inside the susceptor 11. A coolant having a predetermined temperature such as cooling water is supplied from a chiller unit 32 and circulated in the coolant space 31 through lines 33 and 34. A processing temperature of the wafer W on the electrostatic chuck 25 is controlled by a temperature of the coolant.

Further, a heat transfer gas supply unit 35 is connected to the electrostatic chuck 25 through a gas supply line 36. The gas supply line 36 is branched into a wafer side line 36a reaching the central portion 25a of the electrostatic chuck 25 and an edge ring side line 36b reaching the outer peripheral portion 25b of the electrostatic chuck 25. The heat transfer gas supply unit 35 supplies a heat transfer gas to a space between the central portion 25a of the electrostatic chuck 25 and the wafer W through the wafer side line 36a. Further, the heat transfer gas supply unit 35 supplies the heat transfer gas to a space between the outer peripheral portion 25b of the electrostatic chuck 25 and the edge ring 30 through the edge ring side line 36b. A thermally conductive gas, e.g., He gas or the like, is suitable for the heat transfer gas. The heat transfer gas corresponds to an example of a heat medium, and the heat transfer gas supply unit 35 corresponds to an example of a heat medium supply unit that supplies the heat medium.

The shower head 24 disposed at the ceiling portion includes an electrode plate 37 at the bottom thereof having a plurality of gas injection holes 37a and an electrode holder 38 detachably holding the electrode plate 37. Further, a buffer space 39 is disposed in the electrode holder 38, and a gas inlet port 38a communicating with the buffer space 39 is formed at an upper surface of the electrode holder 38. A gas supply line 41 is connected to the gas inlet port 38a. A processing gas supply unit 40 is connected to the gas supply line 41. Further, magnets 42 extending annularly or concentrically are disposed around the processing chamber 10.

The individual components of the plasma processing apparatus 1 are connected to the controller 50. For example, the gas exhaust device 18, the first RF power supply 21a, the second RF power supply 21b, the DC power supplies 27 and 28, the chiller unit 32, the heat transfer gas supply unit 35, and the processing gas supply unit 40 are connected to the controller 50. The controller 50 is, e.g., a computer, and controls the individual components of the plasma processing apparatus 1.

The controller 50 includes a process controller 51 having a central processing unit (CPU) and configured to control the individual components of the plasma processing apparatus 1, a user interface 52, and a storage unit 53.

The user interface 52 includes a keyboard through which a process manager inputs commands to manage the plasma processing apparatus 1, a display that visualizes and displays an operation state of the plasma processing apparatus 1, and the like.

The storage unit 53 is configured to store therein a recipe including processing condition data and a control program (software) for realizing various processes performed by the plasma processing apparatus 1 under the control of the process controller 51. Moreover, when a command is received from the user interface 52, a necessary recipe is retrieved from the storage unit 53 and executed by the process controller 51, so that a desired process is performed in plasma processing apparatus 1 under the control of the process controller 51.

The process controller 51 reads out and executes the control program and the recipe stored in the storage unit 53 to control the individual components of the plasma processing apparatus 1. Accordingly, a desired process is performed in the plasma processing apparatus 1. For example, the process controller 51 controls the individual components of the plasma processing apparatus 1 to perform plasma treatment on the wafer W. Further, the process controller 51 performs an electrostatic attraction process for electrostatically attracting the edge ring 30. Details of the electrostatic attraction process executed by the controller 50 will be described later.

During the plasma treatment in the processing chamber 10, a horizontal magnetic field directed in one direction is formed by the magnets 42, and a vertical RF electric field is formed by an RF voltage applied between the susceptor 11 and the shower head 24. Accordingly, magnetron discharge is performed through a processing gas in the processing chamber 10, and high density plasma is generated from the processing gas near the surface of the susceptor 11.

In the plasma processing apparatus 1, in the case of performing dry etching, first, the gate valve 20 is opened and the wafer W that is a processing target is loaded into the processing chamber 10 and placed on the electrostatic chuck 25. Then, in the plasma processing apparatus 1, a processing gas (e.g., a gaseous mixture of $C_4F_8$ gas, $O_2$ gas, and Ar gas mixed at a predetermined flow rate ratio) is introduced into the processing chamber 10 at a predetermined flow rate and flow rate ratio from the processing gas supply unit 40. In the plasma processing apparatus 1, the pressure in the processing chamber 10 is set to a predetermined value by the gas exhaust device 18 or the like. Further, in the plasma processing apparatus 1, the RF power is supplied to the susceptor 11 from each of the first RF power supply 21a and the second RF power supply 21b. In the plasma processing apparatus 1, a DC voltage is applied from the DC power supply 27 to the electrode plate 26 of the electrostatic chuck 25 to attract and hold the wafer W on the electrostatic chuck 25. In addition, in the plasma processing apparatus 1, a DC voltage is applied from the DC power supply 28 to the electrode plate(s) 29 of the electrostatic chuck 25 to attract and hold the edge ring 30 on the electrostatic chuck 25. The processing gas injected from the shower head 24 is turned into plasma as described above, and the surface of the wafer W is etched by radicals or ions generated by the plasma.

Figure 2:
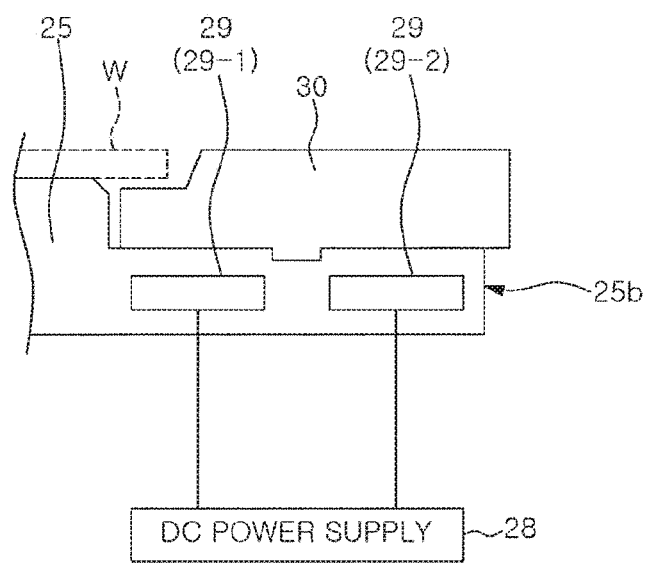
FIG. 2 shows an example of an installation aspect of electrode plates according to the first embodiment.

Next, an installation aspect of the electrode plate(s) 29 shown in FIG. 1 will be described. FIG. 2 shows an example of the installation aspect of the electrode plate(s) according to the first embodiment. As shown in FIG. 2, the two electrode plates 29 are disposed inside the outer peripheral portion 25b of the electrostatic chuck 25 to correspond to the edge ring 30. Hereinafter, the inner electrode plate 29 between the two electrode plates 29 will be referred to as "inner peripheral electrode plate 29-1" and the outer electrode plate 29 will be referred to as "outer peripheral electrode plate 29-2."

The inner peripheral electrode plate 29-1 is annularly disposed at an inner peripheral side of the edge ring 30. The outer peripheral electrode plate 29-2 is annularly disposed at an outer peripheral side of the edge ring 30. The inner peripheral electrode plate 29-1 and the outer peripheral electrode plate 29-2 are electrically connected to the DC power supply 28. In the present embodiment, the case where power is supplied from one DC power supply 28 to the inner peripheral electrode plate 29-1 and the outer peripheral electrode plate 29-2 is described. However, two DC power supplies 28 may be provided to correspond to the inner peripheral electrode plate 29-1 and the outer peripheral electrode plate 29-2, so that the powers are individually supplied thereto.

In the plasma processing apparatus 1, the voltage is applied to the inner peripheral electrode plate 29-1 and the outer peripheral electrode plate 29-2 to attract and hold the edge ring 30. However, charges may be migrated to the edge ring 30, resulting in the decrease of the attraction force of the edge ring 30.

The dielectric film of the electrostatic chuck 25 is made of ceramic. Examples of the ceramic include an alumina plate, alumina spraying, yttria plate, and yttria spraying, or the like. In such ceramics, the electrical resistivity tends to decrease as a temperature increases. Therefore, in a high temperature and high bias environment, charges are migrated from the edge ring 30 to the dielectric film of the electrostatic chuck 25 and the attraction force of the electrostatic chuck 25 decreases.

Figure 3:
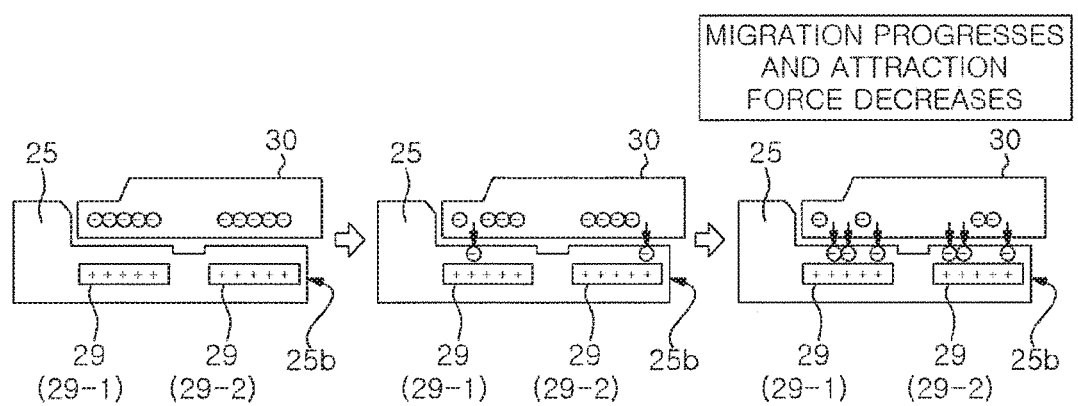
FIG. 3 schematically shows a migration of charges according to a conventional technique.

FIG. 3 schematically shows a migration of charges according to a conventional technique. FIG. 3 shows a simplified configuration of the outer peripheral portion 25b of the electrostatic chuck 25. The electrostatic chuck 25 includes the inner peripheral electrode plate 29-1 and the outer peripheral electrode plate 29-2. For example, as in the conventional technique, the edge ring 30 is attracted and held by applying a constant positive voltage to the inner peripheral electrode plate 29-1 and the outer peripheral electrode plate 29-2. In this case, as shown in FIG. 3, for example, negative charges of the edge ring 30 migrate to the dielectric films above the inner peripheral electrode plate 29-1 and the outer peripheral electrode plate 29-2 and, thus, the attraction force of the edge ring 30 with respect to the electrostatic chuck 25 decreases.

In the plasma processing apparatus 1, when the attraction force of the edge ring 30 with respect to the electrostatic chuck 25 decreases, the leakage amount of the heat transfer gas supplied to the gap between the edge ring 30 and the electrostatic chuck 25 increases.

In the plasma processing apparatus 1, when the leakage amount of the heat transfer gas increases, the efficiency of heat removal from the edge ring 30 decreases and the temperature of the edge ring 30 increases due to heat from the plasma treatment. Accordingly, the processing characteristics of the plasma treatment are changed. Further, in the plasma processing apparatus 1, when the leakage amount of the heat transfer gas increases, the vacuum level is decreased and the plasma characteristics are changed. Accordingly, the processing characteristics of the plasma treatment are changed.

Therefore, as disclosed in Japanese Patent Application Publication No. 2018-206935, for example, it may be considered to apply voltages to the inner peripheral electrode plate 29-1 and the outer peripheral electrode plate 29-2 while periodically switching the polarities of the voltages during plasma treatment.

However, the plasma is affected by the voltage applied to the inner peripheral electrode plate 29-1 and the outer peripheral electrode plate 29-2. Therefore, when the voltages applied to the inner peripheral electrode plate 29-1 and the outer peripheral electrode plate 29-2 are switched during the plasma treatment to reduce the amount of migrated charges, it is necessary to optimize the timing and the cycle of switching the polarities. Various recipes are provided for the plasma treatment. The amount of migrated charges in the plasma treatment varies depending on the recipes of the plasma treatment. Therefore, large man-hours are required to optimize each of the recipes of the plasma treatment.

Therefore, in the plasma processing apparatus 1 of the present embodiment, voltages are applied to the inner peripheral electrode plate 29-1 and the outer peripheral electrode plate 29-2 while switching the polarities of the voltages for each process cycle for the plasma treatment. The controller 50 controls the DC power supply 28 to apply the voltages while switching the polarities of the voltages for each process cycle for the plasma treatment. It is preferable that the voltages have approximately the same value but different polarities. For example, the voltages may be set to +3000V and −3000V having the same absolute value but different polarities. In the case where plasma treatment is performed and post-treatment is subsequently performed on each wafer W, each process cycle is set to a cycle of performing a set of the plasma treatment and the post-treatment so that the controller 50 controls the DC power supply 28 to apply voltages having the same absolute value to the inner peripheral electrode plate 29-1 and the outer peripheral electrode plate 29-2 while reversing the polarities of the voltages for each set of the plasma treatment and the post-treatment. Further, in the case of consecutively performing the plasma treatment on the wafers W while exchanging the wafers W, each process cycle is set to a cycle of performing the plasma treatment on a predetermined number of wafers W so that the controller 50 controls the DC power supply 28 to apply voltages having the same absolute value to the inner peripheral electrode plate 29-1 and the outer peripheral electrode plate 29-2 while reversing the polarities of the voltages whenever the predetermined number of wafers W are processed.

Further, when there are multiple electrode plates 29, the controller 50 applies voltages of different polarities to adjacent electrode plates 29. For example, the controller 50 controls, in each process cycle, the DC power supply 28 to apply voltages having the same absolute value to the inner peripheral electrode plate 29-1 and the outer peripheral electrode plate 29-2 while the polarity of the voltage applied to the inner peripheral electrode plate 29-1 is different from the polarity of the voltage applied to the outer peripheral electrode plate 29-2.

Here, a specific example of a pattern for changing a voltage(s) applied to the electrode plate(s) 29 will be described. First, a pattern for changing voltage(s) applied to the electrode plate(s) 29 for each set of the plasma treatment and the post-treatment will be described.

Figure 4:
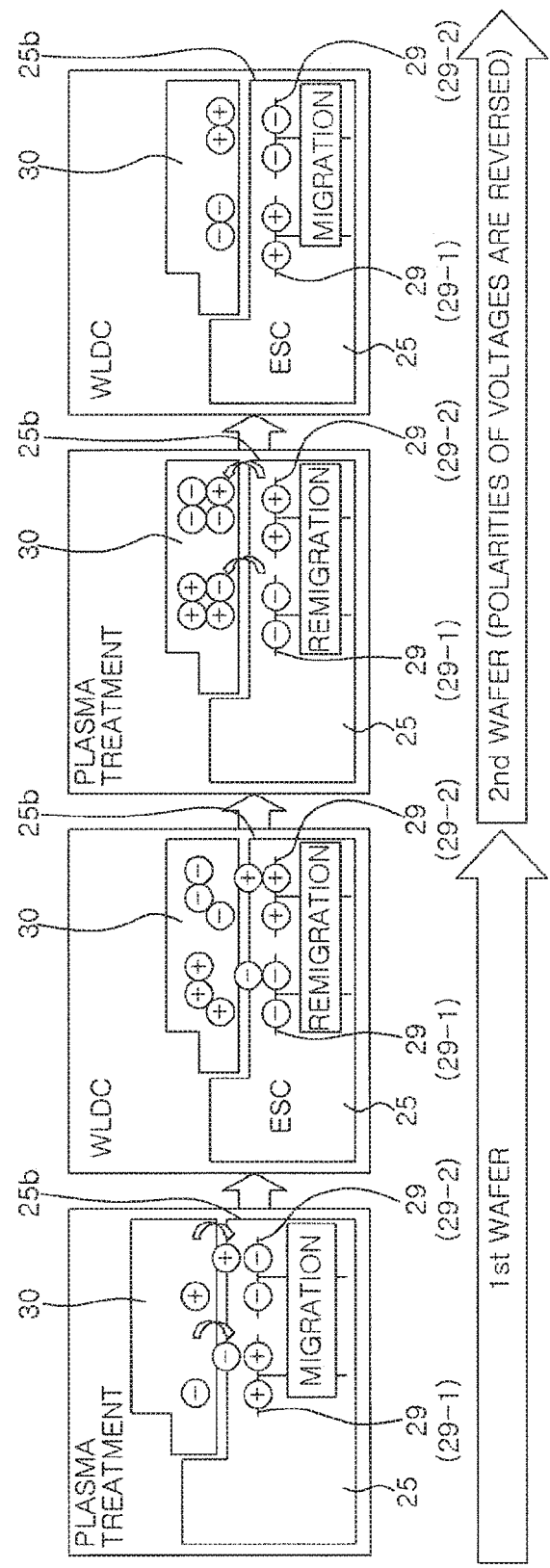
FIG. 4 schematically shows an example of an applied voltage change pattern according to the first embodiment.

FIG. 4 schematically shows an example of an applied voltage change pattern according to the first embodiment. FIG. 4 shows the change pattern of voltages applied to the inner peripheral electrode plate 29-1 and the outer peripheral electrode plate 29-2 in the case of performing a set of plasma treatment and post-treatment sequentially on two consecutive wafers W. Here, the post-treatment is waferless dry cleaning that is performed in a state where no wafer W is placed to clean deposits or the like generated by the plasma treatment. Hereinafter, waferless dry cleaning is also referred to as "WLDC." However, the post-treatment is not limited to WLDC, and may be any treatment performed after the plasma treatment.

The controller 50 controls the DC power supply 28 to apply voltages to the inner peripheral electrode plate 29-1 and the outer peripheral electrode plate 29-2 while reversing the polarities of the voltages for each set of the plasma treatment and the post-treatment (e.g., WLDC). Further, in each set of the plasma treatment and the post-treatment, the controller 50 also controls the DC power supply 28 to apply voltages of different polarities to the inner peripheral electrode plate 29-1 and the outer peripheral electrode plate 29-2.

For example, in the example shown in FIG. 4, in the plasma treatment for a first wafer W, a predetermined positive voltage is applied to the inner peripheral electrode plate 29-1, and a predetermined negative voltage is applied to the outer peripheral electrode plate 29-2. Accordingly, negative charges are generated at an inner portion of the edge ring 30 due to the positive voltage applied to the inner peripheral electrode plate 29-1, so that the edge ring 30 is attracted and held. A part of the generated negative charges migrates to the dielectric film of the electrostatic chuck 25. Meanwhile, positive charges are generated at an outer portion of the edge ring 30 due to the negative voltage applied to the outer peripheral electrode plate 29-2, so that the edge ring 30 is attracted and held. A part of the generated positive charges migrates to the dielectric film of the electrostatic chuck 25.

In the WLDC for the first wafer, the polarities of the voltages applied to the inner peripheral electrode plate 29-1 and the outer peripheral electrode plate 29-2 are switched to apply a predetermined negative voltage to the inner peripheral electrode plate 29-1 and a predetermined positive voltage to the outer peripheral electrode plate 29-2. Accordingly, positive charges are generated at the inner portion of the edge ring 30 due to the negative voltage applied to the inner peripheral electrode plate 29-1, and negative charges are generated at the outer portion of the edge ring 30 due to the positive voltage applied to the outer peripheral electrode plate 29-2. At the inner portion of the edge ring 30, the attraction force of the edge ring 30 is increased due to the negative voltage applied to the inner peripheral electrode plate 29-1 and the negative charges that have migrated to the dielectric film of the electrostatic chuck 25 by the plasma treatment for the first wafer. At the outer portion of the edge ring 30 as well, the attraction force of the edge ring 30 is increased due to the positive voltage applied to the outer peripheral electrode plate 29-2 and the positive charges that have migrated to the dielectric film of the electrostatic chuck 25 by the plasma treatment for the first wafer. At the inner portion of the edge ring 30, the negative charges migrated to the dielectric film of the electrostatic chuck 25 gradually migrate to the edge ring 30. At the outer portion of the edge ring 30, the positive charges migrated to the dielectric film of the electrostatic chuck 25 gradually migrate to the edge ring 30. Hereinafter, the phenomenon that the charges migrated to the dielectric film of the electrostatic chuck 25 migrate to the edge ring 30 is referred to as "remigration."

In the plasma treatment for a second wafer W, as in the WLDC for the first wafer, a predetermined negative voltage is applied to the inner peripheral electrode plate 29-1, and a predetermined positive voltage is applied to the outer peripheral electrode plate 29-2. Accordingly, positive charges are generated at the inner portion of the edge ring 30 due to the negative voltage applied to the inner peripheral electrode plate 29-1. Negative charges are generated at the outer portion of the edge ring 30 due to the positive voltage applied to the outer peripheral electrode plate 29-2. At the inner portion of the edge ring 30, the negative voltage is applied to the inner peripheral electrode plate 29-1 and the negative charges migrated to the dielectric film of the electrostatic chuck 25 due to the plasma treatment for the first wafer are present, so that the attraction force of the edge ring 30 is increased. At the outer portion of the edge ring 30 as well, the positive voltage is applied to the outer peripheral electrode plate 29-2 and the positive charges migrated to the dielectric film of the electrostatic chuck 25 due to the plasma treatment for the first wafer are present, so that the attraction force of the edge ring 30 is increased. At the inner portion of the edge ring 30, the negative charges migrated to the dielectric film of the electrostatic chuck 25 remigrate to the edge ring 30. At the outer portion of the edge ring 30, the positive charges migrated to the dielectric film of the electrostatic chuck 25 remigrate to the edge ring 30.

In the WLDC for the second wafer, the polarities of the voltages applied to the inner peripheral electrode plate 29-1 and the outer peripheral electrode plate 29-2 are switched to apply a predetermined positive voltage to the inner peripheral electrode plate 29-1 and a predetermined negative voltage to the outer peripheral electrode plate 29-2. Accordingly, negative charges are generated at the inner portion of the edge ring 30 due to the positive voltage applied to the inner peripheral electrode plate 29-1, so that the edge ring 30 is attracted and held. Positive charges are generated at the outer portion of the edge ring 30 due to the negative voltage applied to the outer peripheral electrode plate 29-2, so that the edge ring 30 is attracted and held.

Here, the amount of migrated charges in the plasma treatment varies depending on the recipes of the plasma treatment. Generally, in the case of performing the plasma treatment and the WLDC on the wafer W, the plasma treatment is performed on the wafer W in a high temperature and high bias environment and the processing time therefor becomes long, so that the amount of migrated charges increases. For example, on the assumption that the amount of migrated charges in the plasma treatment of the wafer W is MA and the amount of remigrated charges in the WLDC is RA, a charge amount difference $\Delta A$ is represented by the following equation (1):

$$\Delta A = MA - RA > 0 \qquad \text{Eq. (1).}$$

Therefore, when the polarities of the voltages applied to the inner peripheral electrode plate 29-1 and the outer peripheral electrode plate 29-2 are simply switched between the plasma treatment and the WLDC, the charge amount difference $\Delta A$ may be accumulated as the number of processed wafers W increases. Accordingly, the attraction force of the edge ring 30 decreases, and the leakage amount of the heat transfer gas supplied to the gap between the edge ring 30 and the electrostatic chuck 25 increases.

Therefore, in the present embodiment, the voltage(s) applied to the electrode plate(s) 29 is changed for each set of the plasma treatment and the WLDC. Further, in FIG. 4, the voltage(s) applied to the electrode plate(s) 29 is switched after the plasma treatment and before the WLDC. Accordingly, as shown in FIG. 4, the polarities of the voltages applied to the inner peripheral electrode plate 29-1 and the outer peripheral are reversed (switched) between the plasma treatment for the first wafer and the plasma treatment for the second wafer and between the WLDC for the first wafer and the WLDC for the second wafer. In other words, for one set of the first wafer and the second wafer, the polarities of the voltages applied to the inner peripheral electrode plate 29-1 and the outer peripheral electrode plate 29-2 are reversed between the first wafer and the second wafer. The plasma treatment and the WLDC for the first wafer and the second wafer have the same recipe except for the polarities of the voltages applied to the inner peripheral electrode plate 29-1 and the outer peripheral electrode plate 29-2, so that the amount of migrated charges can be considered the same. Since the polarities of the voltages are reversed between the first wafer and the second wafer while the difference $\Delta A$ in the amount of migrated charges between the first wafer and the second wafer are the same in magnitude, the migration of charges can be cancelled by setting two wafers as one set as shown in the following equation (2):

$$\Delta A \text{ (first wafer)} - \Delta A \text{ (second wafer)} = 0 \qquad \text{Eq. (2).}$$

Accordingly, even when the number of processed wafers W increases, the attraction force of the edge ring 30 with respect to the electrostatic chuck 25 can be maintained. As a result, the leakage of the heat transfer gas supplied to the gap between the edge ring 30 and the electrostatic chuck 25 can be suppressed.

Figure 5:
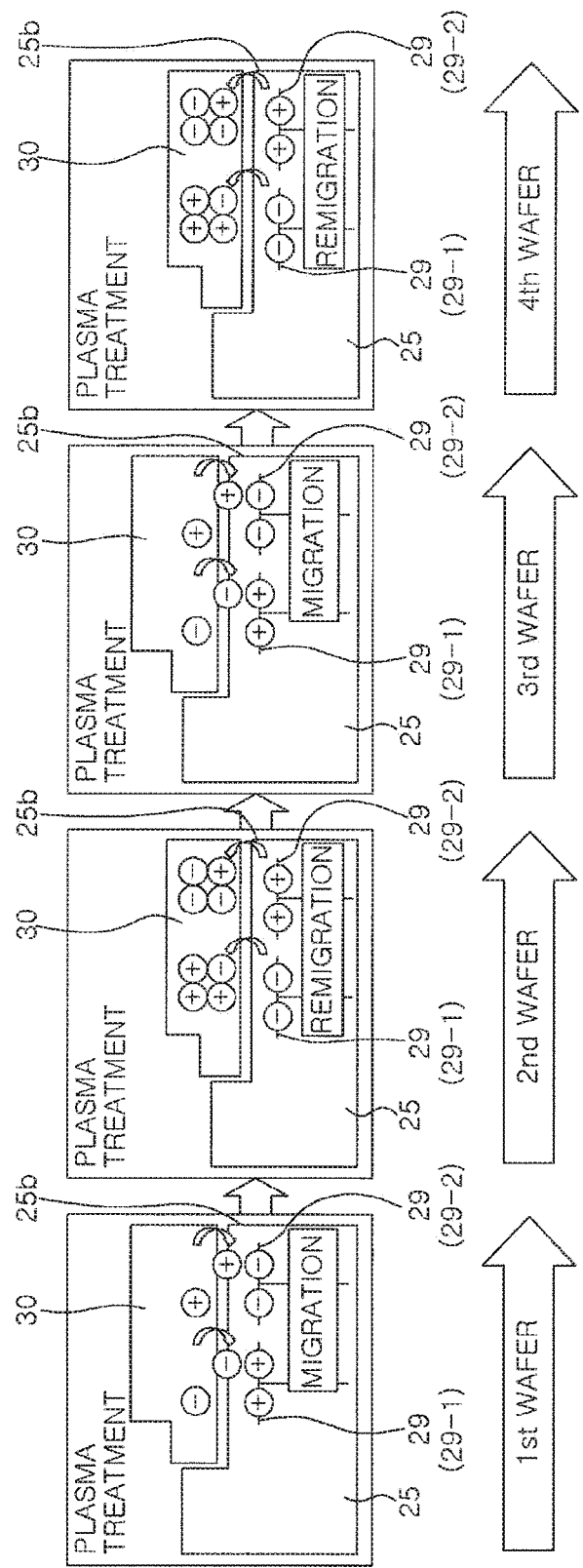
FIG. 5 schematically shows an example of an applied voltage change pattern according to the first embodiment.

Next, a pattern for changing a voltage(s) applied to the electrode plate(s) 29 whenever a predetermined number of wafers W are processed in the case of performing plasma treatment consecutively on the wafers W while exchanging the wafers W will be described. FIG. 5 schematically shows an example of an applied voltage change pattern according to the first embodiment. FIG. 5 shows the change pattern of voltages applied to the inner peripheral electrode plate 29-1 and the outer peripheral electrode plate 29-2 in the case of consecutively performing plasma treatment on four wafers W. The controller 50 controls the DC power supply 28 to apply predetermined voltages to the inner peripheral electrode plate 29-1 and the outer peripheral electrode plate 29-2 while switching the polarities of the voltages whenever one wafer W is processed. Further, in the example of FIG. 5, whenever one wafer W is processed, a predetermined positive voltage and a predetermined negative voltage are alternately applied between the inner peripheral electrode plate 29-1 and the outer peripheral electrode plate 29-2. In this case as well, it is possible to cancel the amount of migrated charges by setting two wafers as one set. For example, on the assumption that the amount of migrated charges in the plasma treatment for the wafer W is MA, the migrated charge amount MA is the same in magnitude while the polarities of the voltages are reversed between the first wafer and the second wafer. Therefore, by setting two wafers as one set, the migration of charges can be canceled as shown in the following equation (3):

$$MA \text{ (first wafer)} - MA \text{ (second wafer)} = 0 \qquad \text{Eq. (3).}$$

Accordingly, even when the number of processed wafers W increases, the attraction force of the edge ring 30 with respect to the electrostatic chuck 25 can be maintained. As a result, the leakage of the heat transfer gas supplied to the gap between the edge ring 30 and the electrostatic chuck 25 can be suppressed.

Next, a test result on a measurement of a leakage amount of a heat transfer gas will be described. In the test, plasma treatment and post-treatment were performed on each of the wafers W while exchanging the wafers W. WLDC was performed as the post-treatment. As an exemplary embodiment, a voltage application pattern shown in "test example" of FIG. 6 was implemented. FIG. 6 is a view explaining the voltage application patterns in the plasma treatment and the WLDC. FIG. 6 schematically shows the application patterns of voltages applied to the inner peripheral electrode plate 29-1 and the outer peripheral electrode plate 29-2 in the plasma treatment and the WLDC. In the test example, as in the case of FIG. 4, the polarities of the applied voltages were switched between the plasma treatment and the WLDC for each set of the plasma treatment and the WLDC. Further, in the test example, as in the case of FIG. 4, the voltages of different polarities were applied to the inner peripheral electrode plate 29-1 and the outer peripheral electrode plate 29-2. "+, −/−, +" in the plasma treatment and "−, +/+, −" in the WLDC represent the voltage application pattern of two wafers forming one set. A left side of "/" represents the voltage application pattern in the first wafer, and a right side of "/" represents the voltage application pattern in the second wafer. In the voltage application pattern in the first wafer and the voltage application pattern in the second wafer, a left side of "," represents a pattern of a voltage applied to the inner peripheral electrode plate 29-1, and a right side of "," represents a pattern of a voltage applied to the outer peripheral electrode plate 29-2. For example, "+, −/−, +" represents that a positive voltage is applied to the inner peripheral electrode plate 29-1 in the first wafer and a negative voltage is applied to the outer peripheral electrode plate 29-2 in the first wafer. Further, "+, −/−, +" represents that a negative voltage is applied to the inner peripheral electrode plate 29-1 in the second wafer and a positive voltage is applied to the outer peripheral electrode plate 29-2 in the second wafer.

The plasma treatment in the test example includes four processes P1 to P4. FIG. 7 is a view explaining voltage application patterns in the plasma treatment. In the processes P1 to P4 of the plasma treatment, the voltages applied to the inner peripheral electrode plate 29-1 and the outer peripheral electrode plate 29-2 were maintained without being changed.

For example, "Bipolar" indicates voltage application patterns in the processes P1 to P4 of the plasma treatment performed on the first wafer W between two wafers forming one set. A left side of "," indicates a pattern of a voltage applied to the inner peripheral electrode plate 29-1, and a right side of "," indicates a pattern of a voltage applied to the outer peripheral electrode plate 29-2. For example, as in the case of FIG. 4, in the plasma treatment performed on the first wafer W between two wafers forming one set, a positive voltage is applied to the inner peripheral electrode plate 29-1 and a negative voltage is applied to the outer peripheral electrode plate 29-2. "Anti Bipolar" indicates voltage application patterns in the processes P1 to P4 of the plasma treatment performed on the second wafer W between two wafers forming one set. In the plasma treatment performed on the second wafer W between two wafers forming one set, a negative voltage is applied to the inner peripheral electrode plate 29-1 and a positive voltage is applied to the outer peripheral electrode plate 29-2.

In the voltage application patterns of the test example, voltages of polarities that are the same as those in the previous WLDC are applied to the inner peripheral electrode plate 29-1 and the outer peripheral electrode plate 29-2 in the plasma treatment and the polarities of the voltages applied to the inner peripheral electrode plate 29-1 and the outer peripheral electrode plate 29-2 are switched in the WLDC, and this pattern was repeated.

Further, in comparison to the present embodiment, the voltage application patterns shown in "comparative example" of FIG. 6 were implemented. In the voltage application patterns of the comparative example, the polarities of the voltages applied to the inner peripheral electrode plate 29-1 and the outer peripheral electrode plate 29-2 are simply switched between the plasma treatment and the WLDC. In the plasma treatment, a positive voltage is applied to the inner peripheral electrode plate 29-1 and a negative voltage is applied to the outer peripheral electrode plate 29-2. In the WLDC, a negative voltage is applied to the inner peripheral electrode plate 29-1 and a positive voltage is applied to the outer peripheral electrode plate 29-2. In the plasma treatment of the comparative example, only the voltages having the patterns shown in "Bipolar" of FIG. 7 are applied.

Figure 8:
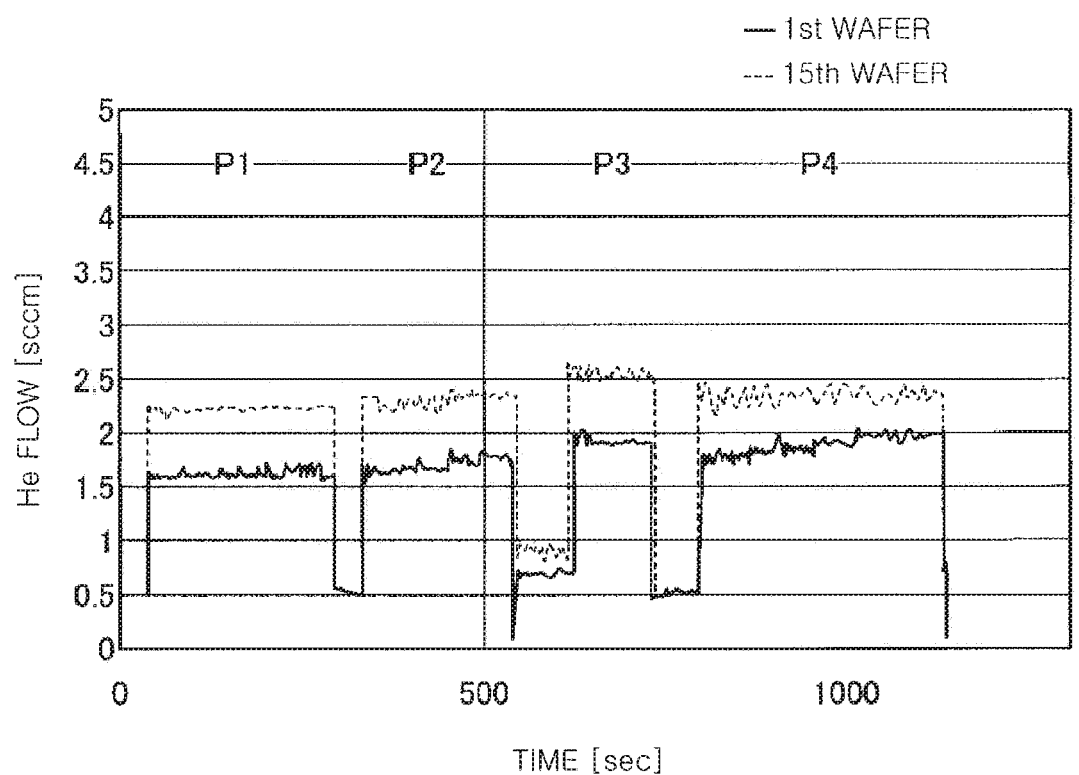
FIG. 8 shows an example of a test result on a measurement of a leakage amount of a heat transfer gas in the case of using a voltage application pattern of a comparative example.
Figure 9:
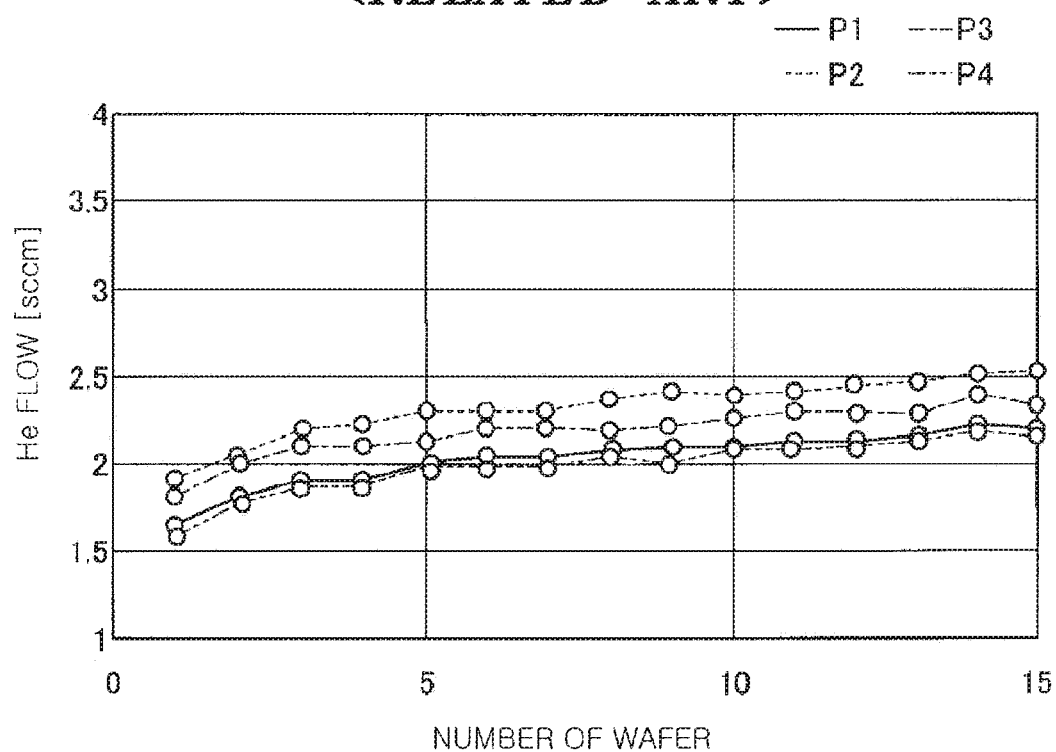
FIG. 9 shows an average leakage amount of the heat transfer gas in each wafer in the case of using the voltage application pattern of the comparative example.

FIG. 8 shows an example of a test result on a measurement of a leakage amount of a heat transfer gas in the case of using the voltage application patterns of the comparative example. FIG. 8 shows a leakage amount of a heat transfer gas (He gas) in each of the processes P1 to P4 for a first wafer and a fifteenth wafer in the case of processing fifteen wafers W using the voltage application patterns of the comparative example shown in FIG. 6. As shown in FIG. 8, in the voltage application patterns of the comparative example, the leakage amount of the heat transfer gas in each of the processes P1 to P4 of the fifteenth wafer is greater than that of the first wafer. FIG. 9 shows an average leakage amount of the heat transfer gas in each wafer W in the case of using the voltage application patterns of the comparative example. FIG. 9 shows the average leakage amount of the heat transfer gas (He gas) in each of the processes P1 to P4 from the first wafer to the fifteenth wafer in the case of processing fifteen wafers W using the voltage application patterns of the comparative example shown in FIG. 6. In each of the processes P1 to P4, the average leakage amount increases from the first wafer toward the fifteenth wafer, and the leakage amount of the heat transfer gas increases as the number of processed wafers increases. It is considered that the leakage amount increases because the charge amount difference ΔA is accumulated as the number of processed wafers W increases, as described above.

Figure 10:
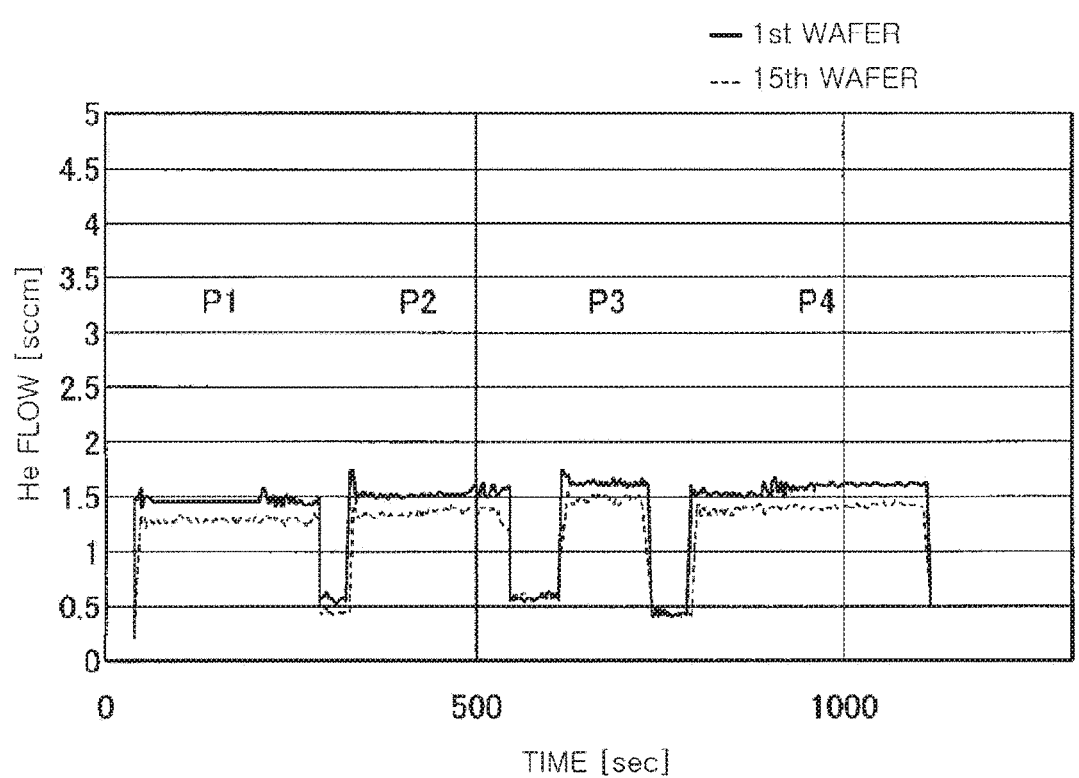
FIG. 10 shows an example of a test result on a measurement of a leakage amount of a heat transfer gas in the case of using a voltage application pattern of a test example.
Figure 11:
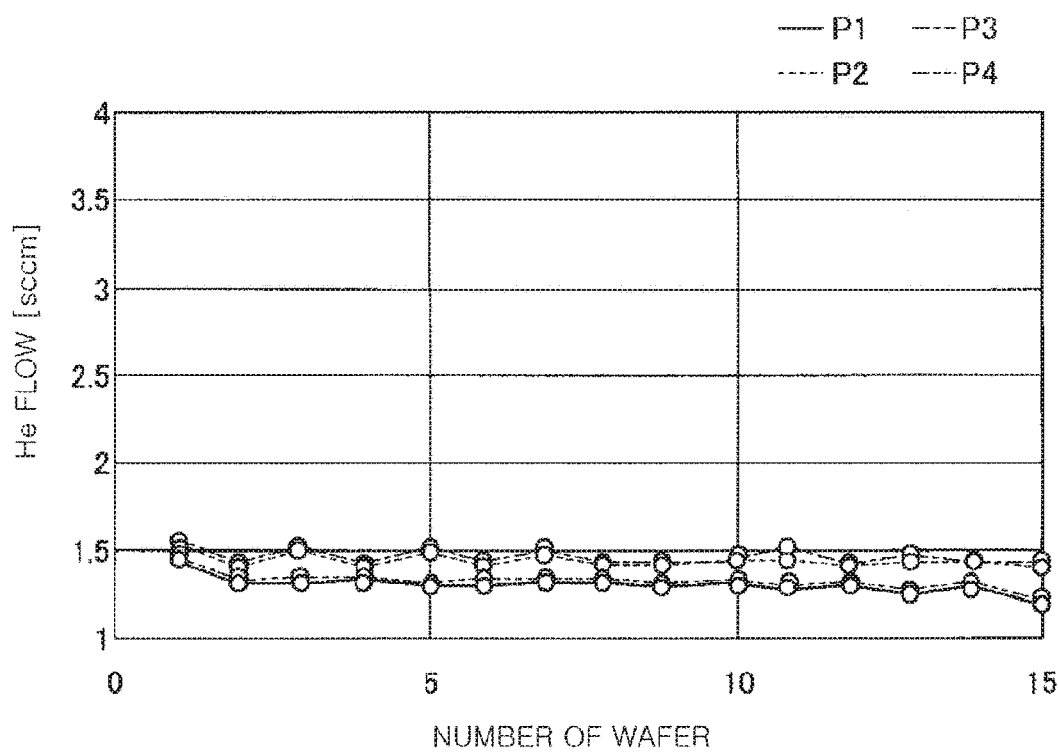
FIG. 11 shows an average leakage amount of the heat transfer gas in each wafer in the case of using the voltage application pattern of the test example.

FIG. 10 shows an example of a test result on a measurement of the leakage amount of the heat transfer gas in the case of using the voltage application patterns of the test example. FIG. 10 shows the leakage amount of the heat transfer gas (He gas) in a first wafer and a fifteenth wafer W in the case of processing fifteen wafers W using the voltage application patterns of the test example shown in FIGS. 6 and 7. As shown in FIG. 10, in the voltage application patterns of the test example, the leakage amounts of the heat transfer gas in the processes P1 to P4 of the first wafer and the fifteenth wafer are substantially equal and low. FIG. 11 shows an average leakage amount of a heat transfer gas in each wafer W in the case of using the voltage application patterns of the test example according to the present embodiment. FIG. 11 shows an average leakage amount of a heat transfer gas (He gas) in each of the processes P1 to P4 from a first wafer to a fifteenth wafer in the case of processing fifteen wafers W using the voltage application patterns of the test example according to the present embodiment. In each of the processes P1 to P4, the average leakage amount does not increase from the first wafer toward the fifteenth wafer and is maintained at a substantially constant level.

As described above, in the case of using the voltage application patterns of the test example according to the present embodiment, the leakage amount of the heat transfer gas can be suppressed even when the number of processed wafers W increases.

Figure 12:
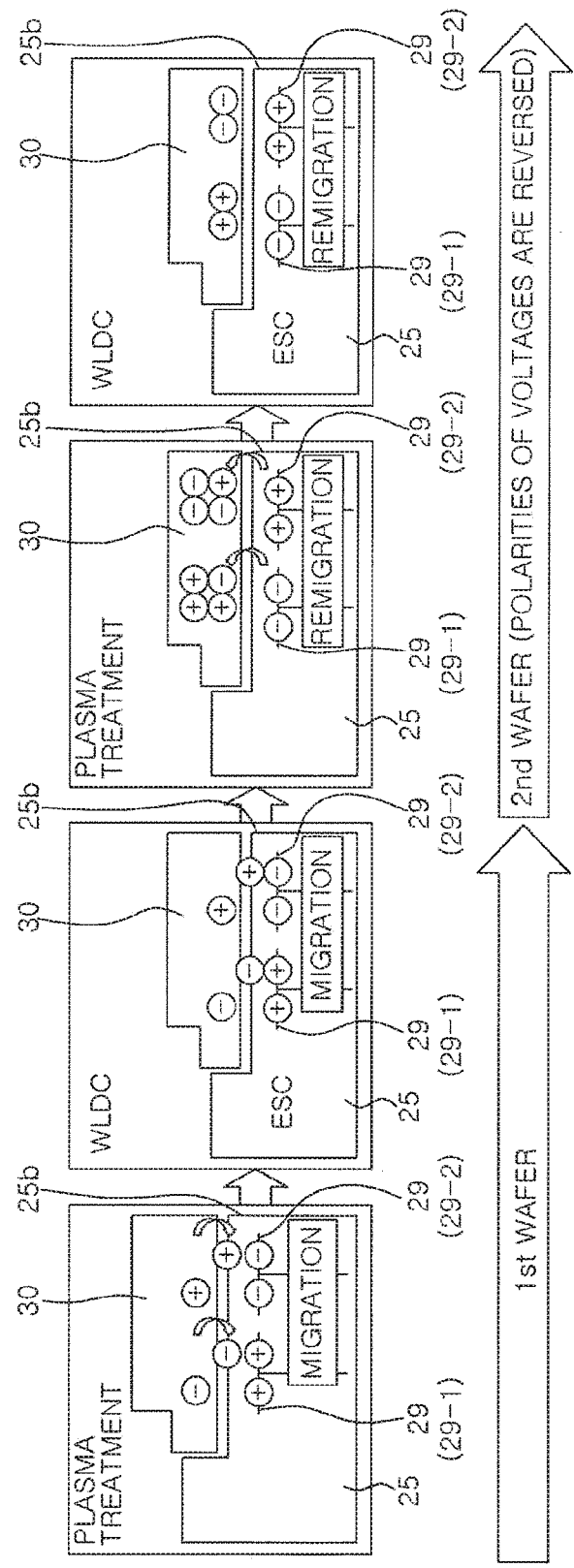
FIG. 12 schematically shows another example of an applied voltage change pattern according to the first embodiment.

The applied voltage change pattern is not limited thereto. For example, in the case of FIG. 4 in which the voltages are applied to the inner peripheral electrode plate 29-1 and the outer peripheral electrode plate 29-2 while switching the polarities of the voltages for each set of the plasma treatment and the post-treatment, the polarities of the voltages may be switched between the post-treatment and next plasma treatment. FIG. 12 schematically shows another example of the applied voltage change pattern according to the first embodiment. In the example of FIG. 12, the polarities of the voltages applied to the inner peripheral electrode plate 29-1 and the outer peripheral electrode plate 29-2 are the same between the plasma treatment and the WLDC for the first wafer and between the plasma treatment and the WLDC for the second wafer, and switched between the WLDC for the first wafer and the plasma treatment for the second wafer. In this case as well, the polarities of the voltages applied to the inner peripheral electrode plate 29-1 and the outer peripheral electrode plate 29-2 are reversed between the first wafer and the second wafer forming one set. Therefore, it is possible to cancel the migration of charges by setting two wafers as one set.

Further, in the example of FIG. 4, the case where the first wafer and the second wafer are set as one set and the polarities of the voltages applied to the inner peripheral electrode plate 29-1 and the outer peripheral electrode plate 29-2 are reversed between the first wafer and the second wafer has been described. However, the present disclosure is not limited thereto. One set of 2n wafers (n being a natural number of 1 or more) may be used, and the polarities of the voltages applied to the inner peripheral electrode plate 29-1 and the outer peripheral electrode plate 29-2 may be reversed between processing of a first wafer to an $n^{th}$ wafer and processing of an $n+1^{th}$ wafer to $2n^{th}$ wafer.

Further, in the example of FIG. 5, the case where the polarity of the voltage(s) applied to the electrode plate(s) 29 is switched whenever one wafer W is processed has been described. However, the present disclosure is not limited thereto. The polarity of the voltage(s) applied to the electrode plate(s) 29 may be switched whenever a plurality of wafers W is processed.

Further, one electrode plate 29 may be disposed at the outer peripheral portion 25b, or three or more electrode plates 29 may be formed at the outer peripheral portion 25b.

Figure 13A:
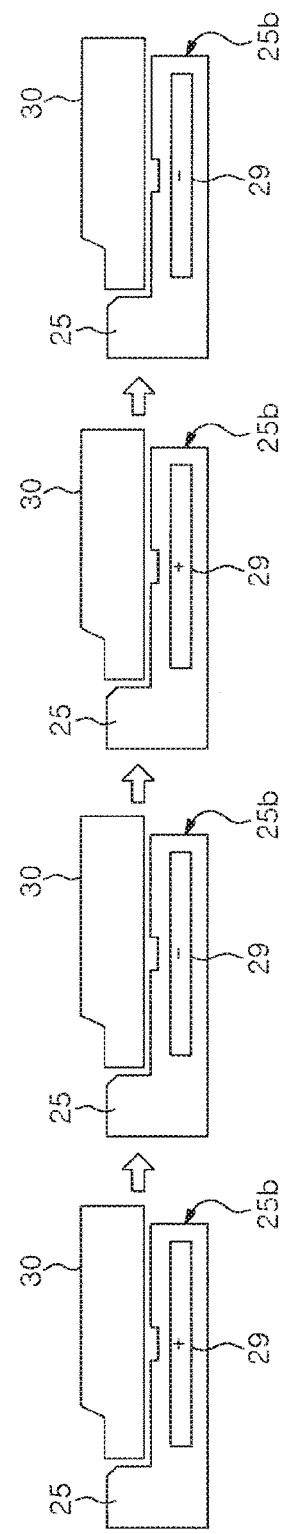
FIG. 13A schematically shows still another example of an applied voltage change pattern according to the first embodiment.

FIG. 13A schematically shows still another example of the applied voltage change pattern according to the first embodiment. FIG. 13A shows an example of the applied voltage change pattern in the case where one electrode plate 29 is formed at the outer peripheral portion 25b. For example, the controller 50 may control the DC power supply 28 to apply a voltage to the electrode plate 29 while switching the polarity of the voltage for each process cycle for plasma treatment. For example, in the case of performing the plasma treatment and subsequently performing the post-treatment on each wafer W, each process cycle is set to a cycle of performing a set of the plasma treatment and the post-treatment so that the controller 50 controls the DC power supply 28 to apply the voltage of the same absolute value to the electrode plate 29 while switching the polarity of the voltage for each set of the plasma treatment and the post-treatment. Further, in the case of consecutively performing the plasma treatment on the wafers W while exchanging the wafers W, for example, each process cycle is set to a cycle of performing the plasma treatment on a predetermined number of wafers W so that the controller 50 controls the DC power supply 28 to apply the voltage of the same absolute value to electrode plate 29 while switching the polarity of the voltage whenever the predetermined number of wafers W are processed.

FIG. 13B schematically shows still another example of the applied voltage change pattern according to the first embodiment. FIG. 13B shows an example of the applied voltage change pattern in the case where three electrode plates 29 (29-1, 29-2, and 29-3) are formed at the outer peripheral portion 25b. For example, the controller 50 may control the DC power supply 28 to apply voltages to the electrode plates 29-1 to 29-3 while switching the polarities of the voltages for each process cycle for plasma treatment. For example, in the case of performing the plasma treatment and subsequently performing the post-treatment on each wafer W, each process cycle is set to a cycle of performing a set of the plasma treatment and the post-treatment so that the controller 50 controls the DC power supply 28 to apply voltages having the same absolute value to the electrode plates 29-1 to 29-3 while switching the polarities of the voltages for each set of the plasma treatment and the post-treatment. Further, in the case of consecutively performing the plasma treatment on the wafers W while exchanging the wafers W, for example, each process cycle is set to a cycle of performing the plasma treatment on a predetermined number of wafers W so that the controller 50 controls the DC power supply 28 to apply voltages having the same absolute value to the electrode plates 29-1 to 29-3 while switching the polarities of the voltages whenever the predetermined number of wafers W are processed. Further, when there are multiple electrode plates 29, the controller 50 applies voltages of different polarities to adjacent electrode plates 29. For example, the controller 50 controls the DC power supply 28 to apply a positive voltage to the electrode plates 29-1 and 29-3 and a negative voltage to the electrode plate 29-2. Alternatively, the controller 50 controls the DC power supply 28 to apply a negative voltage to the electrode plates 29-1 and 29-3 and a positive voltage to the electrode plate 29-2.

The multiple electrode plates 29 may be arranged at the outer peripheral portion 25b side by side along the annular circumferential direction.

Figure 14:
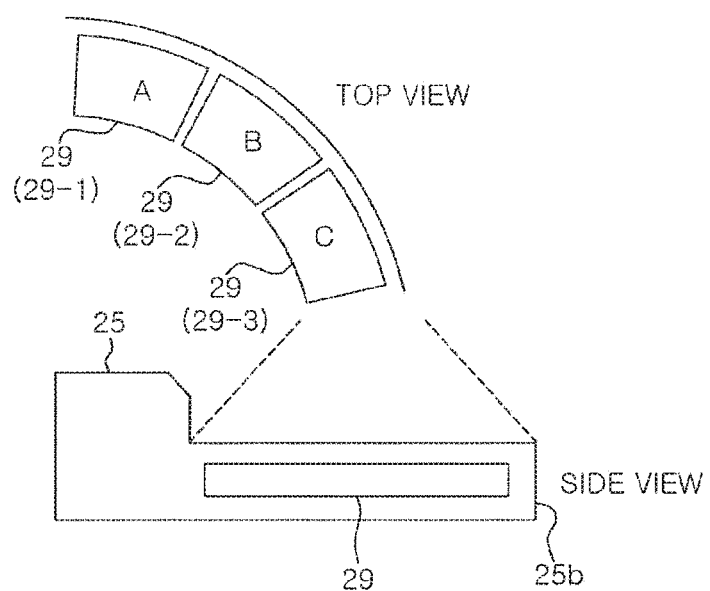
FIG. 14 shows an example of an installation aspect of electrode plates according to the first embodiment.

FIG. 14 shows another example of the installation aspect of electrode plates according to the first embodiment. A schematic top view of the outer peripheral portion 25b of the electrostatic chuck 25 is shown at an upper part of FIG. 14, and a schematic side view of the outer peripheral portion 25b of the electrostatic chuck 25 is shown at a lower part of FIG. 14. In the example of FIG. 14, the three electrode plates 29 (29-1 to 29-3) are arranged at the outer peripheral portion 25b side by side along the circumferential direction. In this case as well, the controller 50 may control the DC power supply 28 to apply voltages to the electrode plates 29-1 to 29-3 while switching the polarities of the voltages for each process cycle for the plasma treatment.

In the plasma processing apparatus 1 of the present embodiment, the case where the controller 50 controls the DC power supply 28 to apply the voltages to the electrode plate(s) 29 while periodically switching the polarities of the voltages has been described. However, the present disclosure is not limited thereto. In the plasma processing apparatus 1, the DC power supply 28 itself may apply the voltages to the electrode plate(s) 29 while periodically switching the polarities of the voltages.

As described above, the plasma processing apparatus 1 according to the first embodiment includes the substrate support (susceptor 11), the electrode(s) (electrode plate(s) 29), and the voltage application unit (DC power supply 28). The substrate (wafer W) serving as a plasma treatment target is placed on the substrate support and the ring member (edge ring 30) is placed on the substrate support to surround the substrate. The electrode is disposed in the substrate support at at least a position corresponding to the ring member. The voltage application unit applies a voltage to the electrode while switching the polarity of the voltage for each process cycle for plasma treatment.

Accordingly, in the plasma processing apparatus 1, it is possible to simply suppress the decrease in the attraction force of the ring member (edge ring 30) even when the plasma treatments of various recipes are performed. As a result, in the plasma processing apparatus 1, it is possible to airtightly seal the space between the electrostatic chuck 25 and the edge ring 30 and suppress an increase in the leakage amount of the heat transfer gas supplied to the space between the edge ring 30 and the electrostatic chuck 25 during the plasma treatment.

Further, in the first embodiment, in the case of consecutively performing the plasma treatment on the multiple substrates while exchanging the substrates, each process cycle for the plasma treatment is set to a cycle of performing the plasma treatment on a predetermined number of substrates. Further, in the case of performing plasma treatment and subsequently performing post-treatment on each substrate, each process cycle for the plasma treatment is set to a cycle of performing a set of the plasma treatment and the post-treatment. Accordingly, in the plasma processing apparatus 1, it is possible to cancel the migration of charges, and thus the decrease of the attraction force of the edge ring 30 can be suppressed.

Further, in the first embodiment, a plurality of electrodes (electrode plates 29-1 to 29-3) is arranged along a radial direction of the ring member. Accordingly, the plasma processing apparatus 1 can control a voltages applied to each of the electrode plates 29, and an attraction force for each of the electrode plates 29 can be controlled.

Further, in the first embodiment, voltages of different polarities are applied to adjacent electrodes (electrode plates 29-1 to 29-3). Accordingly, in the plasma processing apparatus 1, it is possible to increase an attraction force for each of the electrode plates 29.

Second Embodiment

Figure 15:
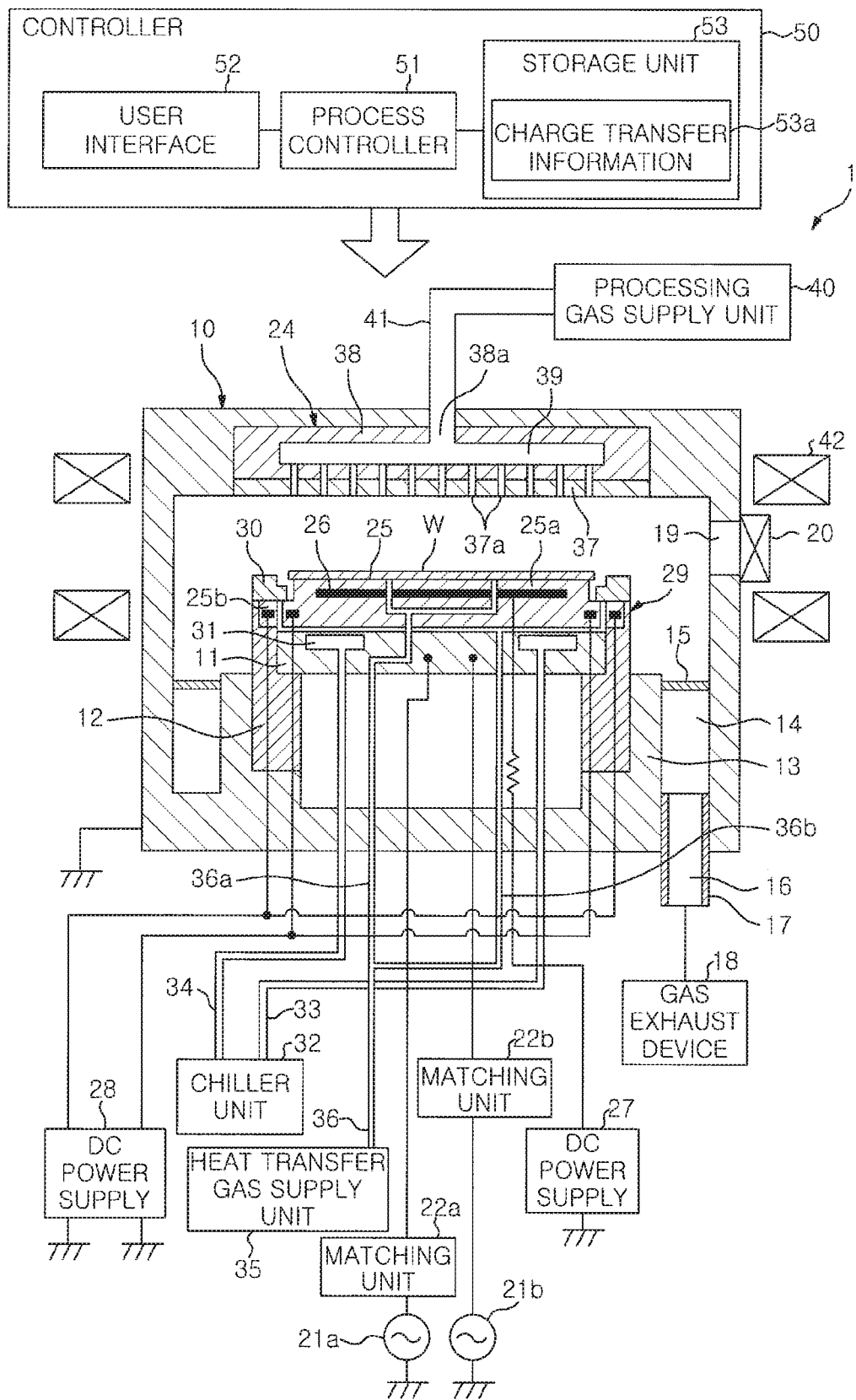
FIG. 15 is a cross-sectional view showing a schematic configuration of a plasma processing apparatus according to a second embodiment.

Next, a second embodiment will be described. FIG. 15 is a cross-sectional view showing a schematic configuration of a plasma processing apparatus 1 according to the second embodiment. The configuration of the plasma processing apparatus 1 according to the second embodiment is partially the same as that of the plasma processing apparatus 1 according to the first embodiment shown in FIG. 1. Therefore, like reference numerals will be given to like parts, and the difference therebetween will be mainly described.

In the plasma processing apparatus 1 according to the second embodiment, charge transfer information 53a is stored in the storage unit 53. The charge transfer information 53a stores the amount of charge transfer between the electrostatic chuck 25 and the edge ring 30 for each type of plasma treatment.

FIG. 16 schematically shows an example of a data structure of the charge transfer information 53a according to the second embodiment. The charge transfer information 53a stores the amount of migrated charges for each type of plasma treatment. The amount of migrated charges for each type of plasma treatment is determined and set by tests or simulations. For example, in the charge transfer information 53a, the amount of migrated charges in the plasma treatment "a" is stored as "3"; the amount of migrated charges in the plasma treatment "b" is stored as "1"; and the amount of migrated charges in the plasma treatment "c" is stored as "12."

The controller 50 determines, before the start of substrate processing, the polarity application pattern of the voltages applied to the electrode plates 29 for each process cycle for the plasma treatment to be performed such that the amount of migrated charges between the electrostatic chuck 25 and the edge ring 30 does not exceed a threshold set depending on the type of the plasma treatment to be performed based on the charge transfer information 53a corresponding to the type of the plasma treatment to be performed. The threshold is, e.g., the amount of migrated charges when the attraction force of the edge ring 30 is decreased by the transfer of charges from the edge ring 30 to the electrostatic chuck 25 to separate the edge ring 30 from the electrostatic chuck 25. The threshold of the charge amount may be stored in the storage unit 53 or may be set from the external device such as the user interface 52 or the like. For example, in the storage unit 53, the threshold of the charge amount is stored as "10." Before the plasma treatment "a" is started, the controller 50 determines the polarity application pattern of the voltages applied to the electrode plates 29 from the threshold and the charge transfer information 53a of the plasma treatment "a".

Specifically, when the amount of migrated charges in the plasma treatment "a" is "3" and the threshold is "10," if four substrates are processed in the plasma treatment "a", the amount of migrated charges exceeds the threshold (3×4=12). Therefore, the voltages of the same polarity can be applied to three wafers at most. Therefore, the controller 50 determines to switch the polarities for every three wafers. However, the controller 50 may also determine to switch the polarities for every wafer or for every two wafers.

In another example, before the start of a set of the plasma treatment "a" and the plasma treatment "b" that is the post-treatment, the polarity application pattern of the voltages applied to the electrode plates 29 is determined from the threshold and the charge transfer information 53a of each of the plasma treatment "a" and the plasma treatment "b". Specifically, when the amount of migrated charges in the plasma treatment "a" and that in the plasma treatment "b" are "3" and "1," respectively, and the threshold is "10," the amount of migrated charges in the substrate processing of a first substrate (e.g., wafer) becomes 4 (3+1=4). Therefore, when three substrates are processed, the amount of migrated charges exceeds the threshold (4×3=12). Accordingly, the voltages of the same polarity can be applied to two wafers at most. Hence, the controller 50 may determine to switch the polarities for every two wafers. However, the controller 50 may also determine to switch the polarities for every wafer.

In the above example of the set of the plasma treatment "a" and the plasma treatment "b" that is the post-treatment, the amount of migrated charges with the same polarity in the plasma treatment "a" and the plasma treatment "b" (when the polarities of the voltages applied to the inner peripheral electrode plate 29-1 and the outer peripheral electrode plate 29-2 in the plasma treatment "a" are "+" and "−," respectively, the polarities of the voltages applied to the inner peripheral electrode plate 29-1 and the outer peripheral electrode plate 29-2 in the plasma treatment "b" are also "+" and "−," respectively) are calculated. However, the amount of migrated charges may be calculated by switching the polarities in the plasma treatment "a" and the plasma treatment "b" (when the polarities of the voltages applied to the inner peripheral electrode plate 29-1 and the outer peripheral electrode plate 29-2 in the plasma treatment "a" are "+" and "−," respectively, the polarities of the voltages applied to the inner peripheral electrode plate 29-1 and the outer peripheral electrode plate 29-2 in the plasma treatment "b" are "−" and "+," respectively). In other words, the amount of migrated charges in the substrate processing of a first substrate becomes 2 (3+(−1)=2). Therefore, when six substrates are processed, the amount of migrated charges exceeds the threshold (2×6=12). Accordingly, the voltages of the same polarity can be applied to five wafers at most. Hence, the controller 50 may determine to switch the polarities for every five wafers. In that case, the controller 50 may also determine to switch the polarities for every one to four wafers. Further, before the start of plasma treatment "c", the threshold and the amount of migrated charges in the plasma treatment "c" are stored as "10" and "12," respectively. If the substrate processing is started in that state, the edge ring may be separated from the electrostatic chuck during the substrate processing of a first substrate. Therefore, the controller 50 may output a notification of prohibiting the start of substrate processing.

As described above, in the plasma processing apparatus 1 according to the second embodiment, before the start of the substrate processing, the voltage polarity application pattern is determined for each process cycle for plasma treatment to be performed based on the charge transfer information and the threshold corresponding to the type of plasma treatment to be performed, thereby changing the polarities of the voltages applied to the electrodes. For example, in the plasma processing apparatus 1, the polarities of the voltages applied to the electrodes for each process cycle for the plasma treatment to be performed are changed based on the charge transfer information 53a so that the amount of migrated charges is reduced depending on the type of the plasma treatment to be performed. Accordingly, in the plasma processing apparatus 1, it is possible to suppress the decrease of the attraction force of the edge ring 30 even when various types of plasma treatments are performed. Thus, the edge ring is prevented from being separated from the electrostatic chuck during the substrate processing of a first substrate.

The presently disclosed embodiments are considered in all respects to be illustrative and not restrictive. The above-described embodiments can be embodied in various forms. Further, the above-described embodiments may be omitted, replaced, or changed in various forms without departing from the scope of the appended claims and the gist thereof.

For example, in the above embodiments, the plasma processing apparatus 1 is configured as a capacitively coupled plasma (CCP) type plasma etching apparatus. However, various modifications can be made without being limited to the above embodiments. For example, the above-described plasma processing apparatus 1 is configured as the CCP type plasma processing apparatus 1. However, the plasma processing apparatus 1 may be applied to any plasma processing apparatus using as the plasma source inductively coupled plasma (ICP), a radial line slot antenna, an electron cyclotron resonance (ECR) plasma, a helicon wave plasma (HWP), or the like.

Although a semiconductor wafer has been described as an example of the substrate, the present disclosure is not limited thereto. The semiconductor wafer may be silicon or may be a compound semiconductor such as GaAs, SiC, GaN, or the like. Further, the substrate is not limited to the semiconductor wafer and may be a glass substrate used for flat panel display (FPD) such as a liquid crystal display or the like, a ceramic substrate, or the like.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made departing from the spirit of the disclosures. The accompanying claims and their equivalents are intended to cover such forms or modifications as would fall within the scope and spirit of the disclosures.

The invention claimed is:

1. A plasma processing apparatus comprising:
a substrate support on which a substrate serving as a plasma treatment target is placed and a ring member is positioned to surround the substrate support;
a first and a second electrodes disposed in the substrate support at a position corresponding to the ring member;
a power supply that applies a voltage to the first and the second electrodes during a set of plasma treatment and post-treatment; and
controller configured to control a pair of the set of plasma treatment and post-treatment for a first substrate and the set of plasma treatment and post-treatment for a second substrate, as one processing cycle,
wherein the controller is configured to control the power supply to apply a first voltage to the first electrode and a second voltage to the second electrode, during performing a first plasma treatment for the first substrate, the second voltage having different polarity from the first voltage,
wherein, subsequent to the first plasma treatment for the first substrate, the controller is configured to control the power supply to apply the second voltage to the first electrode and the first voltage to the second electrode, during performing a first post-treatment for the first substrate,
wherein, subsequent to the first post-treatment for the first substrate, the controller is configured to control the power supply to apply the second voltage to the first electrode and the first voltage to the second electrode, during performing a second plasma treatment for the second substrate, and
wherein, subsequent to the second plasma treatment for the second substrate, the controller is configured to control the power supply to apply the first voltage to the first electrode and the second voltage to the second electrode, during performing a second post-treatment for the second substrate.

2. The plasma processing apparatus of claim 1, wherein the plasma processing apparatus includes two or more electrodes disposed along a radial direction of the ring member.

3. The plasma processing apparatus of claim 2, wherein the power supply applies the voltage to apply different voltage polarities to adjacent electrodes.

4. The plasma processing apparatus of claim 1, wherein the substrate support includes an electrostatic chuck, and the first and the second electrodes are positioned radially inside of an outer periphery of the electrostatic chuck, and
wherein the ring member is an edge ring, and the first and the second electrodes are positioned below the edge ring.

5. The plasma processing apparatus according to claim 4, wherein the controller is further configured to control the power supply to apply different voltage polarities having substantially the same absolute values to adjacent electrodes.

6. The plasma processing apparatus of claim 5, wherein the controller controls the apparatus to process a plurality of substrates consecutively with one substrate exchanged with a next substrate of the plurality of substrates, and with the polarities of the first and the second electrodes different from each other and having substantially the same absolute value for a given substrate, and wherein the controller is further configured to control the apparatus to:
- maintain the polarity of the first electrode as the same for the one substrate and the next substrate, and maintain the polarity of the second electrode as the same for the one substrate and the next substrate, for processing a predetermined number of substrates, and
- after processing the predetermined number of substrates, the controller is configured to switch the polarity of the first electrode to be different than the polarity of the first electrode for an immediately preceding substrate, and the controller is further configured to switch the polarity of the second electrode to be different than the polarity of the second electrode for the immediately preceding substrate.

7. The plasma processing apparatus of claim 6, wherein the controller is configured to control, as the one processing cycle, the set of the plasma treatment and the post-treatment for 2n substrates wherein the n is a natural number of 1 or more.

8. The plasma processing apparatus of claim 5, wherein the controller is configured to control the apparatus to process a plurality of substrates consecutively with one substrate exchanged with a next substrate of the plurality of substrates, and
- wherein the controller is further configured to switch the polarities of the first and second electrodes so that the polarity of the first electrode for the one substrate is different than the polarity of the first electrode for the next substrate and the polarity of the second electrode for the one substrate is different from the polarity of the second electrode for the next substrate.

9. The plasma processing apparatus of claim 8, wherein the controller is configured to control, as the one processing cycle, the set of the plasma treatment and the post-treatment for 2n substrates wherein the n is a natural number of 1 or more.

10. The plasma processing apparatus of claim 1, wherein the post-treatment is a dry cleaning in a state in which no substrate is positioned on the substrate support.

11. The plasma processing apparatus of claim 10, wherein the controller is configured to control the power supply to switch the polarities applied to the first and the second electrodes between the plasma treatment and the dry cleaning.

12. The plasma processing apparatus according to claim 11, wherein: the substrate support includes an electrostatic chuck,
- the ring member includes an edge ring,
- the first and the second electrodes being positioned radially inside of an outer periphery of the electrostatic chuck and below the edge ring,
- the controller is configured to control the power supply to apply different polarities to the first and the second electrodes having substantially the same absolute values, and
- the controller is further configured to control the power supply to apply the first voltage to the first electrode and the second voltage to the second electrode during performing the set of the first plasma treatment and the first post-treatment, apply the second voltage to the first electrode and the first voltage to the second electrode during performing the set of the second plasma treatment and the second post-treatment, by switching the polarities after the first post-treatment and before the second plasma treatment.

13. The plasma processing apparatus of claim 12, wherein the polarity of the first voltage is plus, and the polarity of the second voltage is minus.

14. The plasma processing apparatus of claim 1, wherein the polarity of the first voltage is plus, and the polarity of the second voltage is minus.

* * * * *